US009542035B2

(12) United States Patent
Teissier et al.

(10) Patent No.: US 9,542,035 B2
(45) Date of Patent: Jan. 10, 2017

(54) METHOD FOR CONTROLLING A CAPACITIVE TOUCH PAD

(71) Applicant: STMicroelectronics (Rousset) SAS, Rousset (FR)

(72) Inventors: Maxime Teissier, Aix en Provence (FR); Laurent Beyly, Peynier (FR); Cyril Troise, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 217 days.

(21) Appl. No.: 14/592,194

(22) Filed: Jan. 8, 2015

(65) Prior Publication Data

US 2015/0123943 A1     May 7, 2015

Related U.S. Application Data

(62) Division of application No. 13/309,413, filed on Dec. 1, 2011, now Pat. No. 8,952,709.

(30) Foreign Application Priority Data

Dec. 1, 2010    (FR) ................................. 10 04670

(51) Int. Cl.
     *G06F 3/041*      (2006.01)
     *G06F 3/044*      (2006.01)
     (Continued)

(52) U.S. Cl.
     CPC ............. *G06F 3/0416* (2013.01); *G06F 3/044* (2013.01); *H03K 17/955* (2013.01);
     (Continued)

(58) Field of Classification Search
     CPC .... G01R 27/2605; G06F 3/044; G06F 3/0416; G06F 2203/04108; H03K 17/955; H03K 2217/960725
     See application file for complete search history.

(56) References Cited

U.S. PATENT DOCUMENTS

| 5,457,289 A | 10/1995 | Huang et al. |
| 6,452,514 B1 | 9/2002 | Philipp |
| (Continued) | | |

FOREIGN PATENT DOCUMENTS

| EP | 0 680 006 A1 | 11/1995 |
| EP | 1 593 988 A1 | 11/2005 |
| EP | 1 848 111 A2 | 10/2007 |

*Primary Examiner* — Jermele M Hollington
*Assistant Examiner* — Dustin Dickinson
(74) *Attorney, Agent, or Firm* — Seed IP Law Group LLP

(57) ABSTRACT

The present disclosure relates to a method for measuring a capacitance of a pair of electrodes including charging the pair of electrodes and transferring the charge between the pair of electrodes and a sampling capacitor, and a measuring step representative of the capacitance of the pair of electrodes according to the voltage at the terminals of the sampling capacitor according to the number of cycles executed so that the voltage at the terminals of the sampling capacitor reaches a threshold voltage. According to the present disclosure, the method comprises an initial step of charging the sampling capacitor between a first voltage and a second intermediate voltage in between the first voltage and a third voltage greater than or equal to a ground voltage, the pair of electrodes being charged between the second voltage and the third voltage. The present disclosure applies in particular to the control of a touch pad.

17 Claims, 6 Drawing Sheets

(51) Int. Cl.
    *H03K 17/955* (2006.01)
    *H03K 17/96* (2006.01)
(52) U.S. Cl.
    CPC ............... *H03K 17/9622* (2013.01); *G06F 2203/04108* (2013.01); *H03K 2217/960725* (2013.01)

(56) References Cited

U.S. PATENT DOCUMENTS

| | | | |
|---|---|---|---|
| 6,466,036 B1 | 10/2002 | Philipp | |
| 6,549,193 B1 | 4/2003 | Huang et al. | |
| 6,720,777 B2* | 4/2004 | Wang | G01R 27/2605 |
| | | | 324/658 |
| 7,339,579 B2 | 3/2008 | Richter et al. | |
| 7,509,857 B2* | 3/2009 | Shirasaka | G01C 19/00 |
| | | | 73/1.77 |
| 2005/0162408 A1 | 7/2005 | Martchovsky | |
| 2005/0184965 A1 | 8/2005 | Geaghan et al. | |
| 2006/0250142 A1 | 11/2006 | Abe | |
| 2006/0267580 A1 | 11/2006 | Fukushima et al. | |
| 2007/0062739 A1 | 3/2007 | Philipp et al. | |
| 2007/0262963 A1 | 11/2007 | Xiao-Ping et al. | |
| 2007/0268243 A1 | 11/2007 | Choo et al. | |
| 2008/0142281 A1 | 6/2008 | Geaghan | |
| 2008/0246723 A1 | 10/2008 | Baumbach | |
| 2010/0042346 A1 | 2/2010 | Kuang | |
| 2010/0164759 A1 | 7/2010 | Kivela et al. | |
| 2010/0181180 A1 | 7/2010 | Peter | |
| 2010/0219846 A1 | 9/2010 | Dubery | |
| 2010/0289759 A1 | 11/2010 | Fisher et al. | |
| 2010/0295559 A1 | 11/2010 | Osoinach | |
| 2010/0302202 A1 | 12/2010 | Takeuchi et al. | |
| 2011/0018560 A1 | 1/2011 | Kurashima | |
| 2011/0074446 A1 | 3/2011 | Chou et al. | |
| 2011/0120784 A1 | 5/2011 | Osoinach et al. | |
| 2011/0163766 A1* | 7/2011 | Geaghan | G06F 3/044 |
| | | | 324/678 |
| 2011/0234528 A1 | 9/2011 | Guedon et al. | |
| 2012/0050211 A1 | 3/2012 | King et al. | |
| 2012/0113051 A1 | 5/2012 | Bird et al. | |
| 2012/0139562 A1* | 6/2012 | Beyly | G06F 3/044 |
| | | | 324/679 |
| 2014/0192021 A1* | 7/2014 | Beyly | G06F 3/0416 |
| | | | 345/174 |

* cited by examiner

METHOD FOR CONTROLLING A CAPACITIVE TOUCH PAD

BACKGROUND

Technical Field

The present disclosure relates to a method for detecting an object by means of a detection signal supplied by a capacitive touch pad-type proximity sensor. The present disclosure applies mainly, but not exclusively, to capacitive touch pads implementing a charge transfer technique.

Description of the Related Art

Such a touch pad is widely used for example in man/machine interfaces for inputting system data and commands. Therefore, such a touch pad is designed to detect and locate a finger of the user on the touch pad, i.e., at a distance of less than a few millimeters from the latter. Some touch pads are transparent and are associated with a screen in devices such as mobile telephones.

FIG. 1 represents a touch pad TS comprising electrodes T1, . . . Tp, R1, . . . Rn having the form of bands, which include electrodes Ti (i being a whole number ranging between 1 and p) disposed in columns and electrodes Rj (j being a whole number ranging between 1 and n) disposed in rows transversal to the electrodes Ti. Generally, only one of the so-called "sending" electrodes is activated at a given instant, and so-called "receiving" electrodes are scanned one after the other or simultaneously to obtain measurements representative of the capacitance of each pair of electrodes comprising the active sending electrode and the scanned receiving electrode. The column electrodes Ti (or row electrodes Rj) are connected as sending electrodes, and the row electrodes Rj (or column electrodes Ti) are connected as receiving electrodes. Using the measurements obtained, the position of an object on the touch pad may be determined, given that the presence of an object on the touch pad can change the capacitance of pairs of electrodes located near the object.

Amongst the capacitance measurement methods suited to touch pads, there are particularly methods based on the measurement of a capacitor charge or discharge time, methods based on the use of a relaxation oscillator, and methods based on the charge transfer principle. The methods using a relaxation oscillator involve generating a signal having a frequency which varies according to the capacitance to be measured, then measuring the frequency of that signal. The methods based on charge transfer involve using a "sampling" capacitor, with a high capacitance compared to the capacitances to be measured, charging the capacitance to be measured, and transferring the charge of the capacitance to be measured into the sampling capacitor, and repeating these charge and transfer operations a certain number of cycles. Certain methods based on charge transfer involve executing a fixed number of charge and transfer cycles, and measuring the voltage at the terminals of the sampling capacitor, which is representative of the capacitance to be measured, at the end of the fixed number of cycles. Other methods based on charge transfer execute charge and transfer cycles until the voltage at the terminals of the sampling capacitor reaches a threshold voltage, the number of cycles thus executed being representative of the capacitance to be measured.

An example of implementation of the method based on charge transfer applied to a touch pad is described in U.S. Pat. No. 6,452,514. FIG. 1 represents a control circuit IOC of the touch pad TS, as described in that document. The circuit IOC comprises input/output ports P0, P1, . . . Pn and output ports Pn+1 to Pn+p. Each input/output port Pj (j being a whole number ranging between 1 and n) is connected to a respective input/output stage of the circuit IOC. Each input/output stage comprises a switch I1 controlled by a signal S1, and a transistor M3 the gate of which is controlled by a signal S3. Each switch I1 comprises a terminal connected to a node common to other input/output stages and a terminal connected to the port Pj and to the drain of the transistor M3. The source of each transistor M3 is connected to the ground. Each output port Pn+i (i being a whole number ranging between 1 and p) is linked to a supply voltage source Vdd of the circuit through a transistor M2 the gate of which is controlled by a signal S2. The port P0 is connected to the drain of a transistor M5 the gate of which is controlled by a signal S5 and the source of which is grounded. The port P0 is also connected to a logic circuit LGC supplying the control signals S1, S2, S3, S5 of each input/output and output stage.

To control the electrodes T1-Tp and R1-Rn, the port P0 is connected to a terminal of a sampling capacitor (Cs) the other terminal of which is connected to the ground. The ports P1 to Pn are connected to the row electrodes R1-Rn, and the ports Pn+1 to Pn+p are connected to the column electrodes T1-Tp.

Each row electrode Rj forms with each of the column electrodes Ti a capacitor the capacitance of which varies particularly according to the proximity of an object to an area in which the row electrode overlaps with the column electrode. The circuit LGC receives numbers (i, j) of a pair of ports to be analyzed Pn+i, Pj to locate an object on the touch pad TS, and supplies a measurement DT representative of the capacitance of the pair of electrodes Ti, Rj connected to the selected pair of ports Pn+i, Pj. The measurement representative of the capacitance of the electrode is obtained according to a number of cycles executed for charging the pair of electrodes and transferring the charge to the sampling capacitor Cs, and to the voltage at the terminals of the capacitor Cs after the number of cycles executed.

The logic circuit LGC manages the control circuit IOC that has just been described in accordance with a sequence of steps summarized in Table 1 below:

TABLE 1

| | Port | | | | |
|---|---|---|---|---|---|
| | P0 | Pj | | Pn + i | |
| Step | S5 | S1 | S3 | S2 | Description |
| 1 | 1 | 0 | 1 | 0 | Discharge of Cs and Rj |
| 2 | 0 | 0 | 1 | 0 | Dead time |
| 3 | 0 | 1 | 0 | 1 | Connection of Cs to Rj and Ti to Vdd |
| 4 | 0 | 0 | 1 | 0 | Dead time |
| 5 | 0 | 0 | 1 | 0 | Rj on 0 |
| 6 | 0 | 0 | 1 | 0 | Dead time |
| 7 | 0 | 0 | 1 | 0 | Reading of the charge of Cs |

In Table 1 and below, i and j represent whole numbers varying from 1 to p, and from 1 to n, respectively.

The sequence of steps which comprises steps 1 to 7, is executed successively for each port Pj and each port Pn+i, and thus for each pair of electrodes (Ti, Rj) connected to the circuit IOC. During the execution of this sequence, all the switches I1 and transistors M2, M3 of the circuit IOC, the control signals S1, S2, S3 of which are not mentioned in Table 1, remain open or off. Step 1 is an initialization step during which the signals S3, S5 switch on the transistors M3, M5 connected to the ports P0 and Pj, to discharge the capacitor Cs and the selected electrode Rj. The next step 2 is a dead-time step during which all the transistors M2, M3, M5 are off and all the switches I1 are open. In step 3, the switch I1 connected to the port Pi is closed to enable a charge transfer between the electrode Rj and the capacitor Cs. In parallel, the transistor M2 connected to the port Pn+i is switched on to charge the electrode Ti to the supply voltage Vdd. The result is a charge transfer between the electrode Rj and the capacitor Cs. The next step 4 is a dead-time step, identical to step 2. In the next step 5, the transistor M3 connected to the port Pj is switched on to discharge the electrode Rj. The next step 6 is a dead-time step, identical to step 2. In the next step 7, all the switches I1 remain open and only the transistor M3 connected to the port Pj is switched on. The voltage of the port P0, corresponding to the voltage of the capacitor Cs, is then measured.

The execution of steps 3 to 6 is repeated a certain fixed number of cycles. After executing this number of cycles, the voltage of the port P0 is measured. The presence and the position of an object on the touch pad TS is then determined according to the measurements obtained for each pair of electrodes Ti, Rj. In practice, a finger of a user can only be detected and located on the touch pad TS if it is less than a few millimeters from an overlapping area of the electrodes of a pair of electrodes (Ti, Rj).

In the touch pad control mode previously described, the capacitor Cs receives negative charges from the electrode Rj to which it is linked in step 3. The voltages to be measured to locate an object on the touch pad are thus negative, which complicates the measuring circuit. In other words, such voltages cannot be measured with standard microcontrollers comprising analog-digital converters. To overcome this problem, the negative charge stored in the sampling capacitor is limited to a low value below the threshold voltage of protective diodes of the input ports of the microcontroller. This results in a low dynamic range which limits the detection sensitivity.

It may also be useful to integrate a proximity detector into a system such as a mobile telephone, integrating a touch pad of the type described above, to activate or deactivate the system or more generally, to activate or deactivate certain functions of the system. Thus, the proximity detector may be used to detect when the user moves his hand or a finger to a distance of a few centimeters from the system. For example, control keyboard backlighting may be activated when the user moves his hand toward the keyboard. A proximity detector may also be integrated into a mobile telephone to lock a touch-sensitive keyboard and/or put a screen into low-energy mode during a telephone call, when the user moves the telephone close to his ear.

Generally, such a proximity detection is performed using a dedicated electrode, which is large in size similar to a contact-activatable touch pad electrode. In a mobile telephone, such a proximity detection electrode may be disposed around the keyboard and/or the screen. Due to its large dimensions, it may be difficult to integrate such an electrode into a small system. Adding such an electrode also requires providing a dedicated detector circuit, connected to the electrode to produce a proximity detection function based on a signal supplied by the electrode. Therefore, integrating a proximity detection function into a system contributes to increasing the dimensions, the cost and the current consumption of the system.

BRIEF SUMMARY

It may therefore be desirable to simplify the measuring circuit by avoiding having to measure negative voltages, and to add a proximity detection function in a system comprising a capacitive-type touch pad, without increasing the complexity, size, cost and current consumption of the system.

Some embodiments relate to a method for measuring a capacitance of a pair of electrodes, the method comprising several cycles of charging the pair of electrodes and of transferring the charge between the pair of electrodes and a sampling capacitor, and a measuring step representative of the capacitance of the pair of electrodes according to the voltage at the terminals of the sampling capacitor, after executing a fixed number of cycles, or according to the number of cycles executed so that the voltage at the terminals of the sampling capacitor reaches a threshold voltage.

According to one embodiment, the method comprises an initial step of charging the sampling capacitor between a first voltage and a second intermediate voltage in between the first voltage and a third voltage greater than or equal to a ground voltage, the pair of electrodes being charged between the second voltage and the third voltage.

According to one embodiment, the initial step comprises applying the first voltage to a first terminal of the sampling capacitor, and the second voltage to a second terminal of the sampling capacitor, the charge of the pair of electrodes comprises applying the third voltage to a first electrode of the pair of electrodes, and the second voltage to a second electrode of the pair of electrodes, and the charge transfer between the pair of electrodes and the sampling capacitor comprises establishing a link between the first electrode and the first terminal of the sampling capacitor and applying the second voltage to the second electrode and to the second terminal of the sampling capacitor.

According to one embodiment, the first voltage is equal to a supply voltage, and/or the second voltage is in the order of the first voltage divided by two, and/or the third voltage is equal to the ground voltage.

Some embodiments also relate to a method for controlling a touch pad comprising row electrodes and column electrodes transversal to the row electrodes, the method comprising steps of: determining a measurement representative of the capacitance of each pair of electrodes of a touch pad, in accordance with the method defined above, and determining the position of an object on the touch pad according to the measurements representative of the capacitance of the pairs of electrodes of the touch pad.

According to one embodiment, the control method comprises steps of comparing each measurement representative of capacitance with a first detection threshold defined to detect the presence of an object on the touch pad, and if the comparison of at least one measurement with the first detection threshold reveals the presence of an object on the touch pad, determining the position of the object on the touch pad according to the measurements representative of the capacitance of the pairs of electrodes of the touch pad.

According to one embodiment, the control method comprises a proximity detection mode comprising determining measurements of the capacitance of pairs of electrodes of a group comprising one to four pairs of electrodes of the touch pad, and determining an object proximity detection status according to the measurements representative of the capacitance of the pairs of electrodes of the group.

According to one embodiment, in proximity detection mode, the presence of an object near the touch pad is detected using the measurement representative of the capacitance of a single pair of electrodes comprising a row electrode and a column electrode transversal to the row electrode.

According to one embodiment, in proximity detection mode, the presence of an object near the touch pad is detected using the measurement representative of the capacitance of four pairs of electrodes each located on an edge of the touch pad.

According to one embodiment, the measurement representative of the capacitance of the four pairs of electrodes is taken in one, or in two or four successive measurements.

According to one embodiment, in proximity detection mode, the presence of an object near the touch pad is detected using the measurement representative of the capacitance of a single pair of parallel electrodes each located on an edge of the touch pad.

According to one embodiment, in proximity detection mode, the presence of an object near the touch pad is detected using the measurement representative of capacitance between a first central electrode of the touch pad and two other electrodes parallel to the first electrode and each located on an edge of the touch pad.

According to one embodiment, the measurement representative of the capacitance of the two pairs of electrodes is taken in one or in two successive measurements.

Some embodiments also relate to a device for managing a touch pad comprising a plurality of electrodes disposed in rows and in columns transversal to the rows. According to one embodiment, the device is configured for implementing the control method defined above.

According to one embodiment, the device comprises an input/output circuit comprising: a first port connected to a terminal of a sampling capacitor another terminal of which is connected to the ground, a first group of ports each connected to a respective electrode of the touch pad, linked to the first port through a first switch unit and linked to the ground through a second switch unit, a second group of ports each connected to a respective electrode of the touch pad and each linked to a supply voltage source of the circuit through a third switch unit, and a control circuit configured for controlling the switch units and for supplying, using voltage measurements at a terminal of the sampling capacitor, measurements representative of the capacitance of pairs of electrodes comprising one electrode connected to a port of the first group of ports and one electrode connected to a port of the second group of ports.

According to one embodiment, the device comprises an input/output circuit comprising two groups of ports each linked to a node common to the group of ports through a switch unit, and a control circuit, the first group of ports comprising a first port receiving a reference voltage ranging between the supply voltage of the circuit, several ports each connected to a respective electrode of the touch pad, and a port connected to a first terminal of a sampling capacitor and linked to the ground through a switch unit, and the second group of ports comprising a port connected to a second terminal of the sampling capacitor and linked to the supply voltage source through a switch unit, and several ports each connected to a respective electrode of the touch pad and each linked to the ground through a switch unit, the control circuit being configured for controlling the switch units and for supplying, using voltage measurements at a terminal of the sampling capacitor, measurements representative of the capacitance of pairs of electrodes comprising one electrode connected to a port of the first group of ports and one electrode connected to a port of the second group of ports.

According to one embodiment, the input/output circuit comprises at least three groups of ports each linked to a common node through a respective switch unit controlled by the control circuit, one port of a group of ports being connected to a terminal of several sampling capacitors, another terminal of each of the sampling capacitors being connected to a port of another respective group of ports.

According to one embodiment, the control circuit is configured for controlling the switch units so as to execute several cycles of charging a pair of electrodes, of transferring the charge between the pair of electrodes and the sampling capacitor, and of comparing with a threshold the voltage at a terminal of the sampling capacitor the other terminal of which is grounded, until the compared voltage reaches the threshold voltage, the capacitance to be measured being determined according to the number of cycles executed.

According to one embodiment, the control circuit is configured for controlling the switch units so as to execute a fixed number of cycles of charging a pair of electrodes, and of transferring the charge between the pair of electrodes and the sampling capacitor, and for measuring the voltage at a terminal of the sampling capacitor the other terminal of which is grounded, the capacitance to be measured being determined according to the voltage measured.

Some embodiments also relate to a processor comprising a device like the one defined above.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 1:
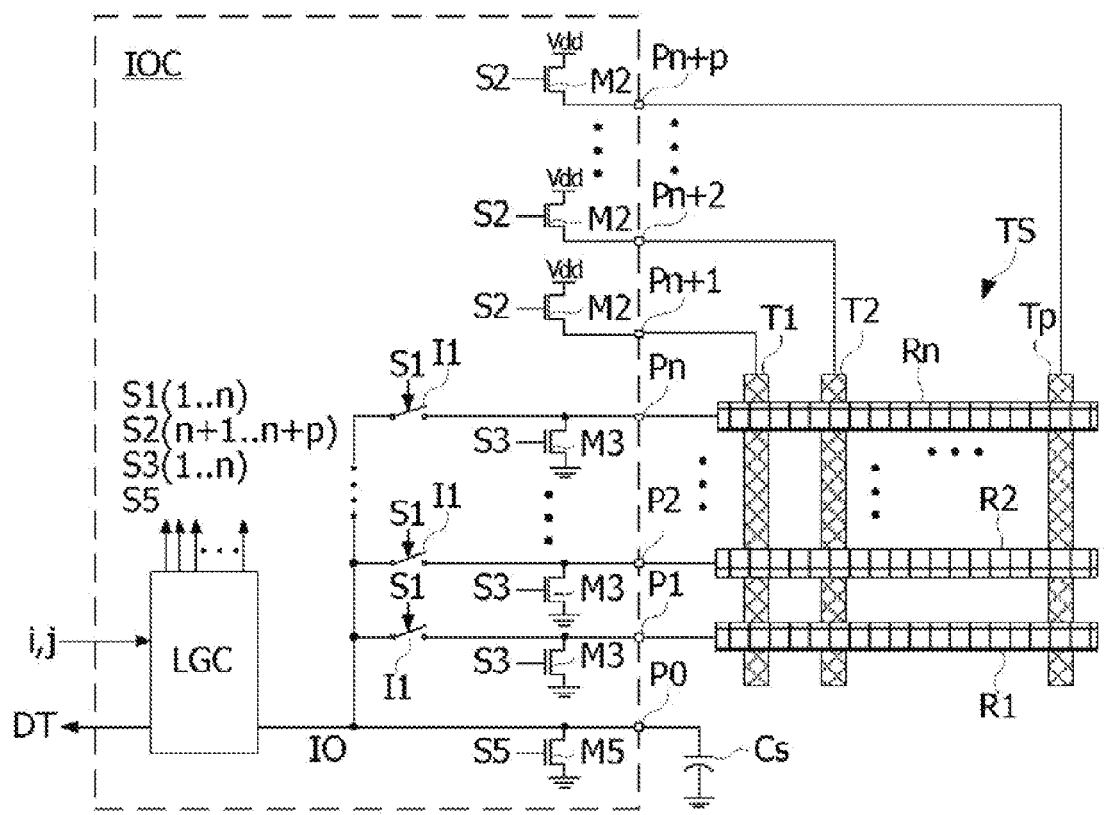
FIG. 1 described above schematically represents a touch pad and a control circuit of the touch pad, according to prior art.
Figure 2:
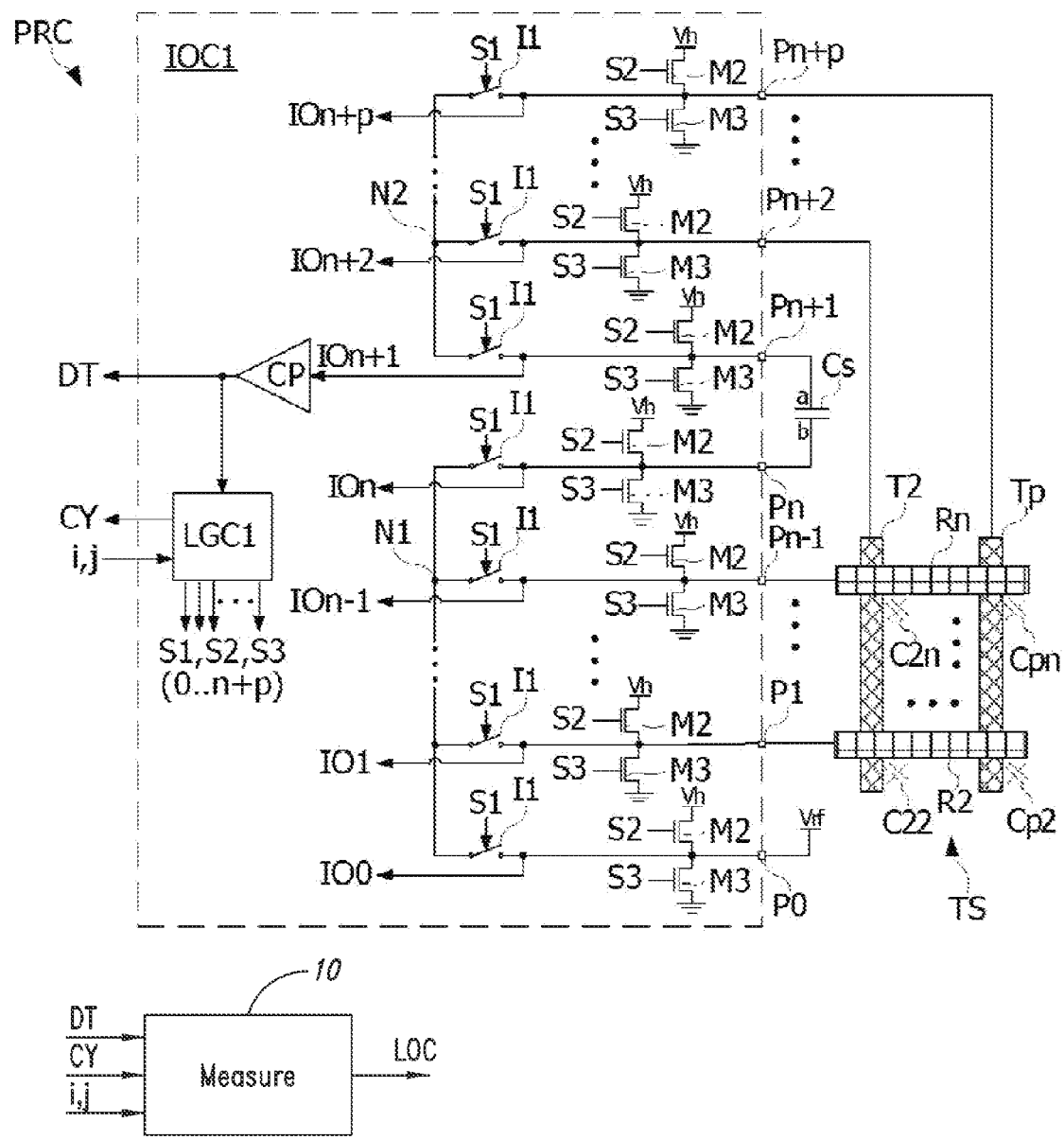
FIG. 2 represents a touch pad control circuit, according to one embodiment.

FIG. 2 represents a touch pad system that includes a touch pad TS and a processor PRC, according to one embodiment. The processor PRC includes a control circuit IOC1 for controlling the touch pad TS and a location detector 10 for determining a location of an object on or near the touch pad and outputting a signal LOC representative of that location. The processor PRC is for example of microcontroller type. The circuit IOC1 comprises n+p+1 input/output ports P0, P1, . . . Pn+p of the processor PRC. Each port Pi (i being a whole number ranging between 0 to n+p) is connected to a respective input/output stage of the circuit IOC1. Each input/output stage comprises a switch I1 controlled by a signal S1, and two transistors M2, M3 the gates of which are controlled respectively by signals S2, S3. The switch I1 comprises a terminal connected to a node common to other input/output stages and a terminal connected to the port Pi, to the source of the transistor M2, and to the drain of the transistor M3. The drain of the transistor M2 receives a voltage Vh which can be the supply voltage of the circuit, and the source of the transistor M3 is connected to the ground. The circuit IOC1 comprises two groups of input/output stages each comprising a common node N1, N2, the switches I1 of the ports P0 to Pn being connected to a first common node N1, and the switches I1 of the ports Pn+1 to Pn+p being connected to a second common node N2, not linked to the common node N1. In addition, at least one of the ports, for example the port Pn+1, is connected to an output IOn+1 connected to the input of a comparator CP. The output of the comparator CP is connected to a logic circuit LGC1 supplying the control signals S1, S2, S3 of each input/output stage. Each of the other ports P0 to Pn+p may also be connected to an output IO0 to IOn+p connected to a comparator (not represented) which may be identical to the comparator CP and the output of which is connected to the circuit LGC1.

According to one embodiment, to control electrodes T2-Tp and R2-Rn of the touch pad TS so as to detect the position of an object on the touch pad, one of the ports connected to a comparator, for example the port Pn+1 connected to the comparator CP, is connected to a terminal a of a sampling capacitor Cs the other terminal b of which is connected to a port of the other group of input/output stages, for example the port Pn. Therefore, whatever the status of the switches I1, the terminals of the capacitor Cs cannot be short-circuited. Furthermore, the port P0 for example, receives a reference voltage Vrf lower than the voltage Vh, for example the voltage Vh divided by 2, and the other ports are each connected to an electrode Ti, Rj. In the example in FIG. 2, the ports P1 to Pn−1 are connected to the row electrodes R2-Rn, and the ports Pn+2 to Pn+p are connected to the column electrodes T2-Tp. It shall be noted that, unlike the example in FIG. 2, it is not necessary for the number of row electrodes to be equal to the number of column electrodes.

The row electrodes Rj form, together with the column electrodes Ti, capacitors C22, . . . Cnn the capacitance of which varies particularly according to the proximity of an object. The comparator CP supplies the circuit LGC1 and the location detector 10 with a detection signal DT. The circuit LGC1 receives a pair of numbers of ports to be analyzed Pi, Pj to detect the presence of an object on the touch pad TS, and supplies to the location detector 10 a number of cycles CY that were used to discharge the capacitor Cs below a certain threshold detected by the comparator CP. This threshold is for example in the order of Vh/3.

The logic circuit LGC1 manages the control circuit IOC1 that has just been described in accordance with a sequence of steps summarized in Table 2 below:

TABLE 2

| Port | Pn + i | | Pn + 1 | | Pn | | Pj − 1 | P0 | |
|---|---|---|---|---|---|---|---|---|---|
| Step | S1 | S3 | S1 | S2 | S1 | S3 | S1 | S1 | Description |
| 1 | 0 | 0 | 0 | 1 | 1 | 0 | 0 | 1 | Charge of Cs between Vh and Vrf |
| 2 | 0 | 0 | 0 | 0 | 0 | 0 | 0 | 0 | Dead time |
| 3 | 0 | 1 | 0 | 0 | 0 | 0 | 1 | 1 | Charge of Cij between 0 and Vrf |
| 4 | 0 | 0 | 0 | 0 | 0 | 0 | 0 | 0 | Dead time |
| 5 | 1 | 0 | 1 | 0 | 1 | 0 | 1 | 1 | Charge transfer between Cij and Cs |
| 6 | 0 | 0 | 0 | 0 | 0 | 0 | 0 | 0 | Dead time |
| 7 | 0 | 0 | 0 | 0 | 0 | 1 | 0 | 0 | Reading of the charge of Cs |

In Table 2 and below, i and j represent whole numbers ranging between 2 and p, and between 2 and n, respectively, and the signals S1, S2, S3 for the respective input/output stages are identified according the respective port to which the input/output stages are connected.

The sequence of steps which comprises steps 1 to 7, is executed successively for each port Pn+i and each port Pj−1, and therefore for each pair of electrodes (Ti, Rj) connected to the circuit IOC1. During the execution of this sequence, all the switches I1 and the transistors M2, M3 of the circuit IOC1, the control signals S1, S2, S3 of which are not mentioned in Table 2, remain open or off. In step 1, the switch I1 of the stage connected to the port Pn is closed, while the signal S2 switches on the transistor M2 connected to the port Pn+1, and the signal S1 closes the switch I1 connected to the port P0. Therefore, the terminals a and b of the capacitor Cs are respectively connected to Vh and Vrf, to charge the capacitor Cs to the supply voltage minus the reference voltage (Vh−Vrf). The next step 2 is a dead-time step during which all the transistors M2, M3 are off and the switches I1 are open. In step 3, the capacitor Cij formed by the electrodes Ti and Rj is charged to Vrf. For this purpose, the transistor M3 connected to the port Pn+i is switched on using the corresponding signal S3 to put the electrode Ti to the ground. In parallel, the switches I1 connected to the port Pj−1 and to the port P0 are open to put the electrode Rj to the voltage Vrf. The next step 4 is a dead-time step, identical to step 2. In the next step 5, the switches I1 connected to the ports Pn+j, Pn+1, Pn, Pj−1 and P0 are closed simultaneously to transfer electric charges between the terminals of the capacitor Cs and the electrodes Ti, Rj. Therefore, the terminal a of the capacitor Cs is linked to the electrode Ti which was put to the ground in step 3, and the terminal b of the capacitor Cs is linked to the electrode Rj which was put to the voltage Vrf in step 3. Furthermore, the terminal b of the capacitor Cs is put to the voltage Vrf. The capacitor Cs is thus discharged in the capacitor Cij formed by the electrodes Ti and Rj. The next step 6 is a dead-time step, identical to step 2. In the next step 7, the transistor M3 of the stage connected to the port Pn is switched on to put the terminal b of the capacitor Cs to the ground, so as to enable the voltage at the terminal a of the capacitor Cs to be read by the comparator CP.

The execution of steps 2 to 7 is then repeated a certain number of cycles until the signal at the input of the comparator CP, corresponding to the voltage at the terminals a and b of the transistor Cs, reaches a certain low threshold voltage value. The number of cycles of executing steps 2 to 7 varies according to the capacitance Cij between the electrodes Ti and Rj, and thus makes it possible to determine whether or not a finger of the user is near (at a distance of a few millimeters from) the overlapping area between the electrodes Ti and Rj. The dead-time steps 2, 4, 6 make sure that the switching actions of the switches I1 and of the transistors M1, M3 are completed before controlling other switching actions. The duration of these steps may be adapted to the switching characteristics (particularly switching time) of the transistors and of the switches, and to the characteristics of the control signals S1, S2, S3. When the voltage at the terminals of the capacitor Cs reaches the threshold voltage, the sequence of steps 1 to 7 is executed successively with the other pairs of electrodes Ti, Rj of the touch pad TS. The processor PRC may therefore determine the position of an object placed on the touch pad TS, if the number of cycles CY of executing steps 2 to 7 is greater or lower than a detection threshold value for one or more pairs of electrodes Ti, Rj.

It shall be noted that a measurement representative of the capacitance of each pair of electrodes of the touch pad TS may also be determined by setting the number of cycles of executing steps 2 to 7 for each pair of electrodes to a certain value, and by measuring the voltage of the capacitor Cs, i.e., the voltage of the port Pn+1 after executing the fixed number of cycles.

The capacitor Cs is selected so as to have a high capacitance compared to that of the capacitors Cij in the absence of excitation by the presence of an object. In practice, with a capacitor Cs of a few tens of nano-farads, the ratio between the capacitance of the capacitor Cs and that of each of the pairs of electrodes Ti, Rj corresponding to the gain of the device, can reach 1,000 to a few thousand. The number of cycles CY for the voltage of the capacitor Cs to reach the threshold voltage thus can be on the order of several hundred. The difference in the numbers of cycles CY obtained with a pair of electrodes Ti, Rj depending on whether the latter is excited or not by the presence of a finger may reach a few tens of cycles. It will be understood that the sensitivity of the detection may be increased using a sampling capacitor with a greater capacitance.

It can be noted, according to Table 2, that the status of some of the transistors M2 and M3 never changes during the execution of the sequence of steps 1 to 7 for all the pairs of electrodes. Thus, the transistors M2, except for the one connected to the port Pn+1, always remain off. The transistors M3 connected to the ports P0 to Pn−1 and Pn+1 are always off too. The circuit IOC1 may therefore be simplified by removing these components. Furthermore, combinations of commands for controlling the switches and transistors M2, M3 other than those indicated in Table 2 may enable the same results to be obtained as regards the connections of the electrodes and of the capacitor Cs between themselves, or to the ground or to the voltage sources at Vh and Vrf.

It shall also be noted that the number of electrodes Ti, Rj that may be connected to the circuit IOC1 depends on the pace at which the pairs of electrodes Ti, Rj can be successively analyzed in relation to a desired detection response time, given the number of cycles for the voltage of the capacitor Cs to reach the threshold voltage. If more electrodes Ti, Rj must be provided, the circuit IOC1 may comprise more groups of independent ports, each group of ports connected to electrodes Rj comprising a port connected to a terminal of a respective sampling capacitor, and a terminal receiving the voltage Vrf. Furthermore, the groups of ports connected to the electrodes Ti are interconnected, a port of the groups of ports connected to electrodes Ti being connected to the other terminal of each of the sampling capacitors.

Figure 3:
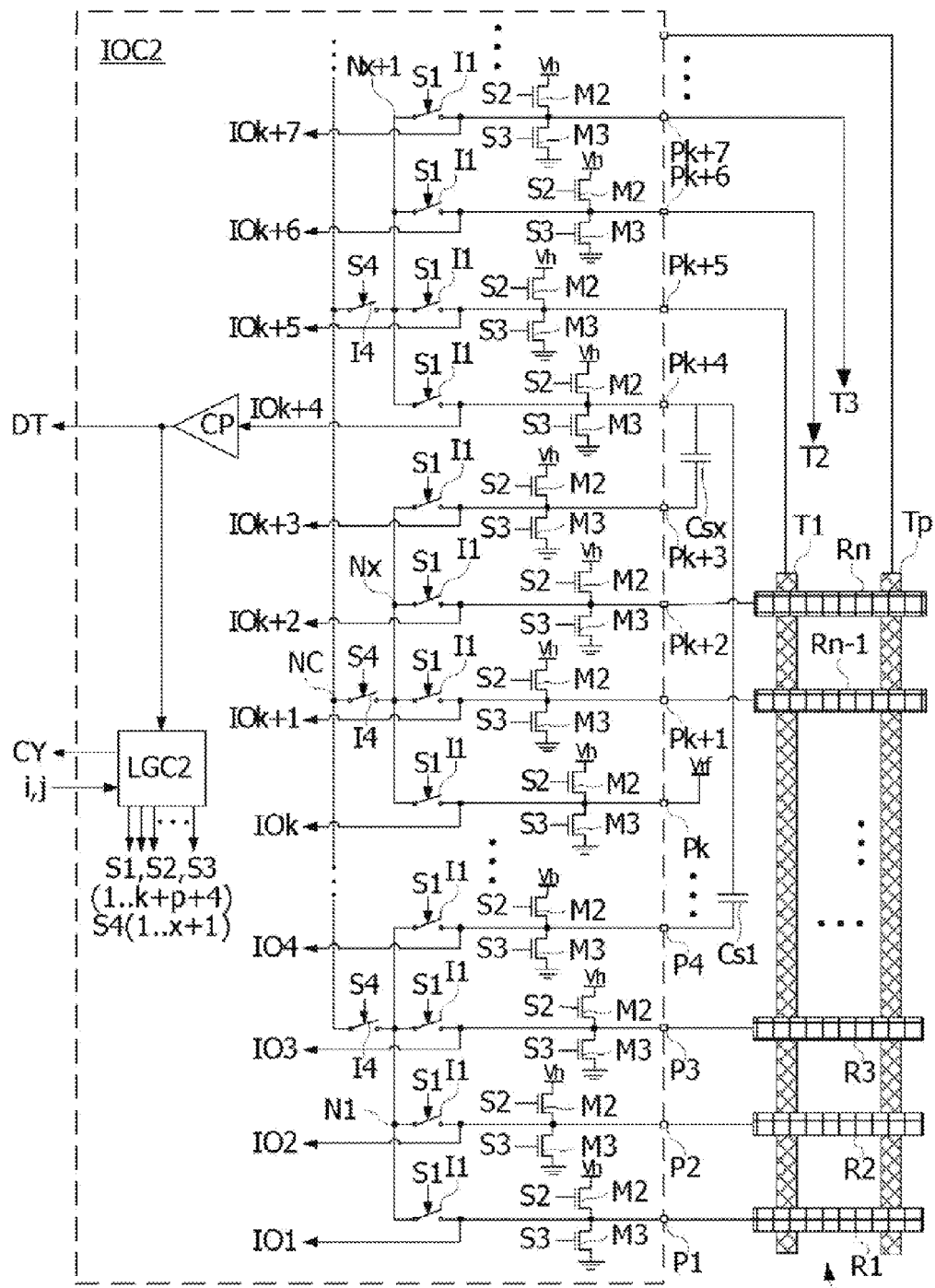
FIG. 3 represents a touch pad control circuit, according to another embodiment.

FIG. 3 represents a control circuit IOC2 of the touch pad TS, according to another embodiment. The circuit IOC2 differs from the circuit IOC1 in that the input/output ports with their respective stages are grouped together into several groups of input/output ports, each group of ports being linked to a node NC common to all the groups of ports through a respective switch I4 controlled by a control signal S4. Each port of each group of ports is connected to a node N1, . . . Nx, Nx+1 common to the ports of the group of ports. In the example in FIG. 3, the circuit IOC2 comprises groups of ports P1 . . . P4, Pk . . . Pk+3, Pk+4 . . . Pk+7, . . . each comprising four ports. The switches I2 and I4 and the transistors M2, M3 of each group of ports are controlled by a logic circuit LGC2 also connected to the output of a comparator CP connected to the port Pk+4. Certain groups of ports are connected to row electrodes R1 to Rn and other groups of ports are connected to column electrodes T1 to Tp. Each group of ports connected to row electrodes Rj comprises a port P4, Pk+3 connected to a sampling capacitor Cs1 . . . Csx. A port Pk of a group of ports connected to row electrodes Rj receives the reference voltage Vrf, for example the supply voltage Vh divided by two. Furthermore, a port Pk+4 of a group of ports connected to column electrodes Ti is connected to the other terminal of all the sampling capacitors Cs1 . . . Csx.

In the example in FIG. 3, the ports P1 to P3 of the group of ports P1 . . . P4 are connected to the row electrodes R1 to R3. The port P4 of the first group is connected to a terminal of a sampling capacitor Cs1. The ports Pk+1 and Pk+2 of the group of ports Pk . . . Pk+3 are connected to the row electrodes Rn−1 and Rn. The port Pk+3 is connected to a terminal of a sampling capacitor Csx. The port Pk+4 of the group of ports Pk+4 . . . Pk+7 is connected to the other terminal of the capacitor Csx. The ports Pk+5 to Pk+7 are connected to the column electrodes T1 to Tp.

The circuit IOC2 may be managed so as to activate a column electrode Ti and simultaneously analyze one row electrode Rj per group of ports connected to row electrodes. The circuit IOC2 is controlled in accordance with the sequence of steps 1 to 7 of Table 2, except that in step 3, several ports Pj−1 are active simultaneously to charge the pairs of electrodes comprising the active electrode Ti and the active electrodes Rj (connected to the active ports Pj−1), and in steps 1 and 5, several sampling capacitors Cs1 . . . Csx are charged and discharged simultaneously. In step 7, the voltage of each of the capacitors Cs1 . . . Cx is compared successively with the threshold voltage by the comparator CP by putting the other terminal of the capacitor to the ground. When all the capacitors Cs1 . . . Csx have reached the threshold voltage, the sequence of steps 1 to 7 is executed with other electrodes Rj and/or another electrode Ti. Whenever the threshold voltage is reached by a capacitor, the number of cycles CY reached is stored in association with the references i, j of the corresponding pair of electrodes Ti, Rj.

According to one embodiment, the processor PRC is configured for managing the electrodes Ti, Rj also in a proximity detection mode wherein an object can be detected at a distance of several centimeters from the touch pad TS. For this purpose, the processor PRC comprises the input/output circuit IOC, IOC1 or IOC2. The location detector 10 of the processor PRC may compare the number of cycles CY supplied by the circuit LGC1 or LGC2 either with a first detection threshold defined for the mode of locating an object on the touch pad, or with a second detection threshold defined for the proximity detection mode. The first detection threshold may be adjusted to detect and locate an object, for example a finger of the user, when the object is less than a few millimeters from the touch pad. The second detection threshold may be adjusted to detect an object when the latter is at a distance in the order of a few centimeters from the touch pad. To increase the detection distance in proximity detection mode, provision can be made in this mode to use a sampling capacitor with a greater capacitance than the one used in the locate mode, the sampling capacitor having a terminal connected to a free port of the circuit IOC, IOC1, IOC2, and a terminal connected to the ground in the case of the circuit IOC, or to the sampling capacitor Cs, Cs1, Csx used in the locate mode in the case of the circuits IOC1 and IOC2.

Figure 4:
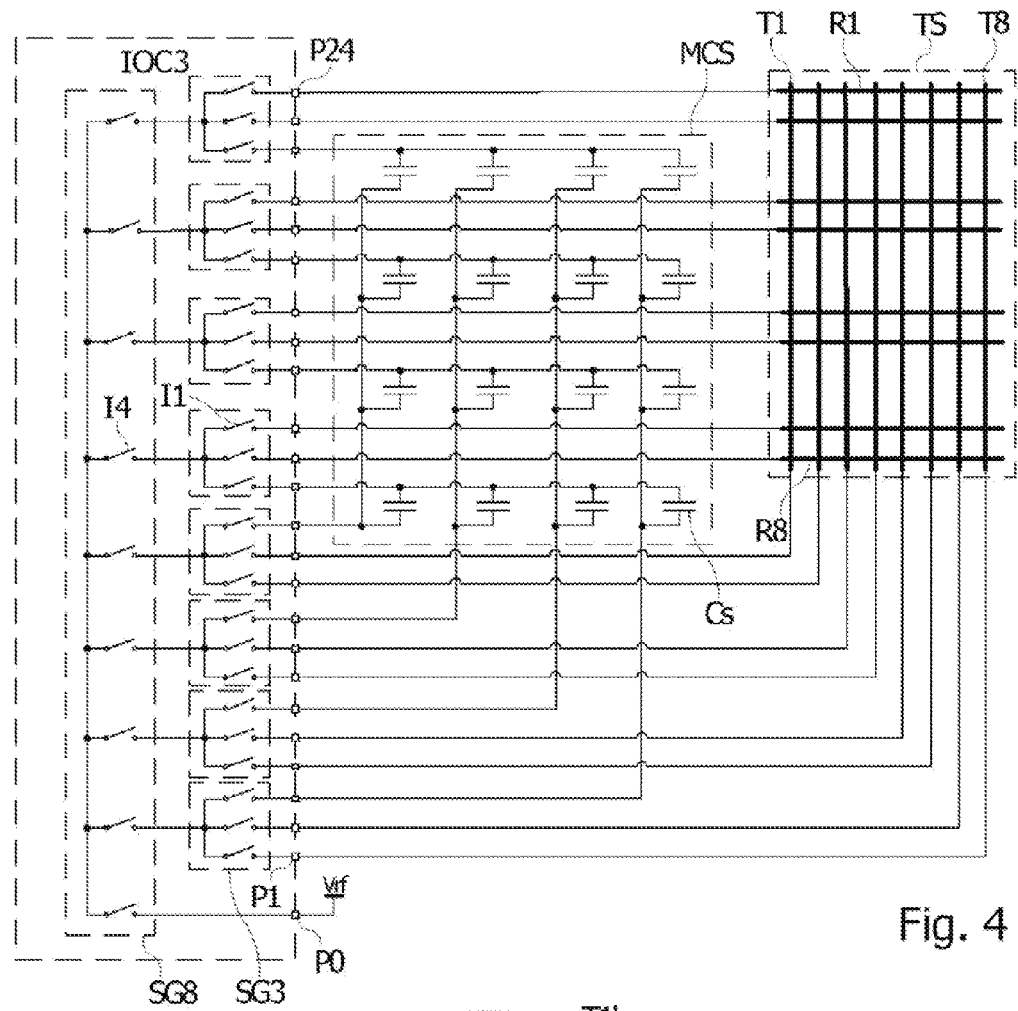
FIG. 4 represents a touch pad control circuit, according to another embodiment.

FIG. 4 represents a control circuit according to another embodiment. In FIG. 4, the control circuit IOC3 differs from the control circuit 102 in that it comprises a group SG8 of eight switches I4, and eight groups SG3 of three switches I1 connected to a switch I4 of the group SG8. For greater clarity, the transistors T2, T3 connected to each of the switches I1 and the comparators CP and the circuit LGC2 have not been represented. Each of the switches I1 is connected to a respective input/output port P1-P24 of the circuit IOC3. Furthermore, the circuit IOC3 comprises an additional port P0 connected to one of the switches I4 of the group SG8.

The circuit IOC3 is used to control a touch pad TS of eight column electrodes T1-T8 and of eight row electrodes R1-R8 forming 64 intersections of electrodes. For this purpose, two switches I1 of each of four groups SG3 are connected to two of the column electrodes T1-T8, and two switches I1 of each of the other four groups SG3 are connected to two of the row electrodes R1-R8. The circuit IOC3 is connected to a set MCS of sixteen capacitors Cs arranged as a matrix, and each connected to a link disposed in a row and a link disposed in a column. Each switch I1 of each of the four groups SG3 connected to column electrodes T1-T8, is connected to a row link linked to four capacitors Cs of the set MCS. Each switch I1 of each of the four groups SG3 connected to row electrodes R1-R8 is connected to a column link connected to four capacitors Cs of the set MCS. Each capacitor Cs of the set MCS is therefore connected between a group SG3 connected to column electrodes T1-T8 and a group SG3 connected to column electrodes R1-R8. Furthermore, the port P0 receives the reference voltage Vrf. The switches I1, I4 and the transistors T2, T3 connected to each switch I1 are controlled so as to activate a single column electrode T1-T8 at a time and to activate all the row electrodes R1-R8 simultaneously, so as to simultaneously measure the capacitances of the pairs of electrodes Rj, Ti activated.

In practice, if it is desirable to be able to determine the position of an object on the touch pad TS, the electrodes Rj, Ti may have the form of a band. The location detector 10 determines the position of the object on the touch pad by performing interpolations applied between the measurements of the capacitance of adjacent pairs of electrodes Rj, Ti.

If it is desirable to produce a physical keyboard, the electrodes may have narrower sections in the vicinity of the areas overlapping with the transversal electrodes, and wider sections in the areas between the overlapping areas.

Figure 5:
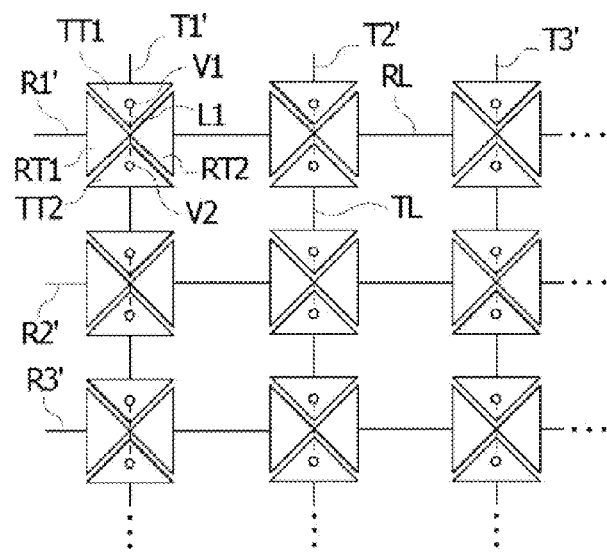
FIGS. 5 and 6 represent examples of forms of electrodes.

FIG. 5 represents an example of form and arrangement of electrodes R1', R2', R3', . . . , T1', T2', T3', . . . . In FIG. 5, the row R1', R2', R3', . . . and column T1', T2', T3', . . . electrodes comprise electrically conductive pads each consisting of two triangular surfaces RT1, RT2, TT2, TT2 the vertexes of which are in contact for example for the electrodes Rj', and slightly spaced out for the electrodes Ti'. The two surfaces TT2, TT2 of each conductive pad of each electrode Ti are interconnected by an electric link L1 connected to the two triangular surfaces TT1, TT2 by vias V1, V2. The conductive pads of each electrode Rj are interconnected in a row by links RL, by the base of the triangular surfaces RT1, RT2, and the conductive pads of each electrode Ti are interconnected in a column by links TL, by the base of the triangular surfaces TT1, TT2.

Figure 6:
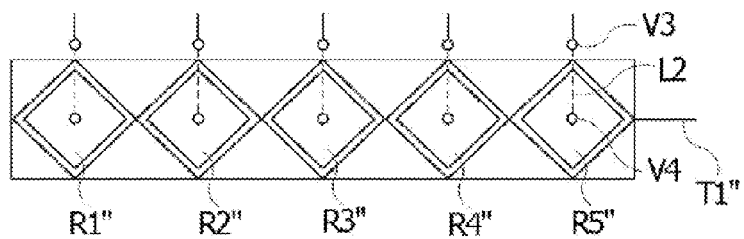

FIG. 6 represents another example of form and arrangement of electrodes T1", R1", R2", . . . R5" forming a slider. The electrode T1" has the form of an electrically conductive band in which lozenge-shaped orifices are made in each of which a lozenge-shaped electrode R1", R2", . . . R5" is formed slightly smaller than the orifice. The electrodes R1"-R5" can be linked to a control circuit IOC, IOC1, IOC2, IOC3 through vias V3, V4 and an electric link L2 between the vias. The electrode T1" can be connected to a control circuit IOC, IOC1, IOC2, IOC3 like a column electrode, and the electrodes R1"-R5" can be connected to the control circuit like a row electrode.

Instead of forming a band, the electrode T1" can be in the shape of a circular crown to form a wheel. An additional electrode may then be disposed in the center of the circular crown used as a central button, this central electrode then being connected to the control circuit like a row electrode.

Figure 7:
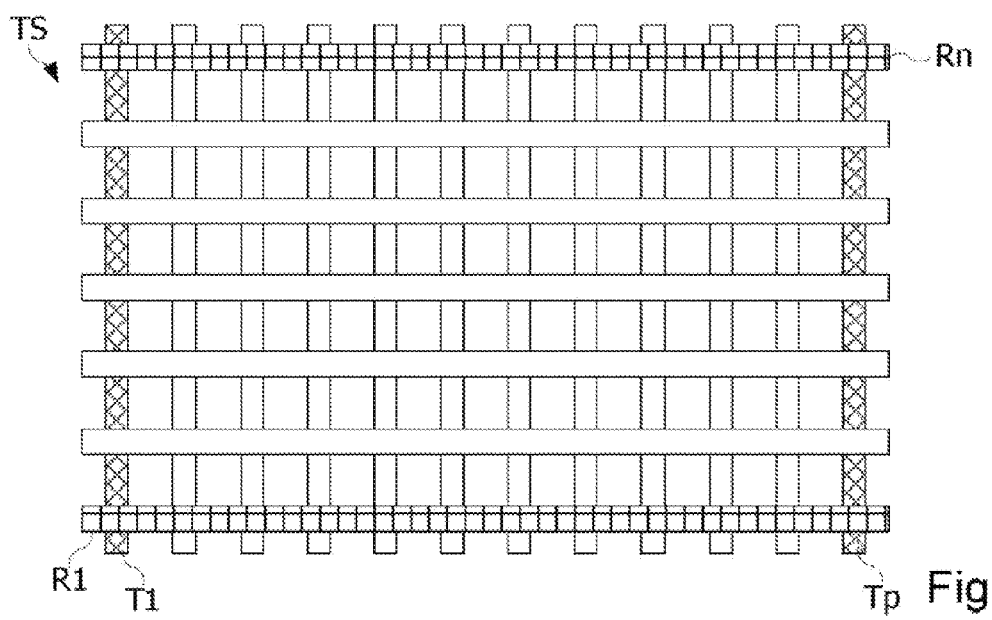
FIGS. 7 to 10 represent a touch pad, controlled in various ways to perform a proximity detection of an object.

In the proximity detection mode, several configurations of active electrodes Ti, Rj may be implemented. FIGS. 7 to 10 represent configurations of active electrodes that may be implemented to detect the proximity of an object. On these figures, the electrodes controlled as a sending electrode (column Pn+i of Table 2) are represented with a double oblique hachure, and the electrodes controlled as a receiving electrode (column Pj−1 of Table 2) are represented with a double horizontal and vertical hachure. Thus, FIG. 7 represents the touch pad TS controlled in proximity detection mode in which the electrodes on the edges of the touch pad, i.e., the first and last row electrodes R1, Rn and column electrodes T1, Tp, are activated simultaneously, to exchange electric charges with the sampling capacitor Cs. The circuits in FIGS. 2 and 3 allow this control mode, because different switch units I1, M2, M3 are provided for each of the ports of the circuit IOC1 or IOC2. Indeed, Table 2 may be executed simultaneously with two row electrodes (ports Pj−1) and two column electrodes (ports Pn+i). The proximity detection may also be performed in two successive acquisitions, each of the two acquisitions being performed with a single one of the two electrodes T1, Tp active and the two electrodes Rj active simultaneously. The proximity detection can also be performed in four successive acquisitions, with one acquisition per pair of electrodes used in the proximity detection mode. In the event of several successive acquisitions, the presence of an object near the touch pad may be determined for example by adding the measurements obtained and by comparing the result of the addition with the proximity detection threshold, or by comparing each measurement with the proximity detection threshold.

Figure 8:
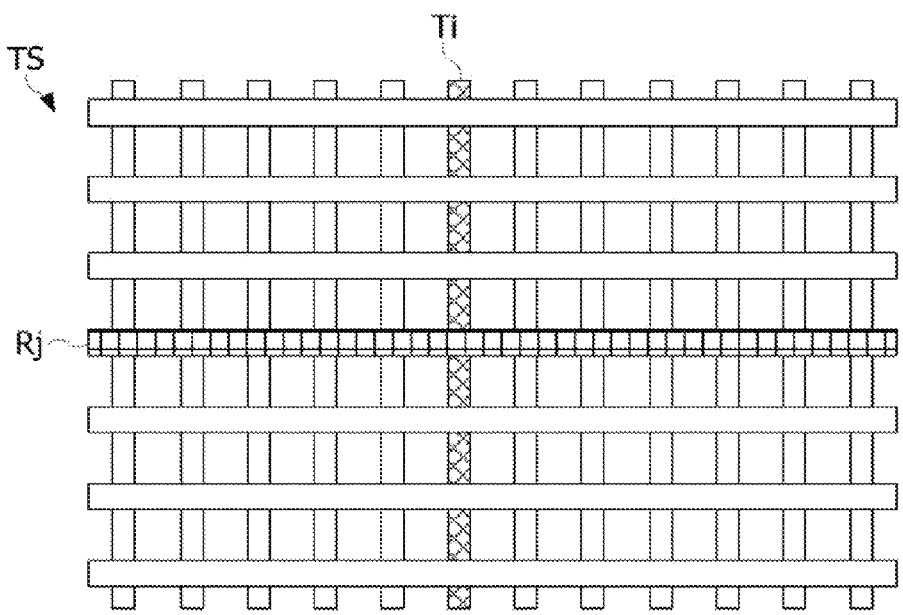

In FIG. 8, only one row electrode Rj and one column electrode Ti are activated. The overlapping area of the activated electrodes Rj and Ti may be substantially in the center of the touch pad TS. In this configuration, the control mode of the circuit IOC1, IOC2 corresponds to the one indicated in Table 2. The proximity detection is then performed by activating the two electrodes Ti and Ri and by selecting the proximity detection threshold applied to the number of cycles CY. In this proximity detection configuration, the detection distance is greater in the vicinity of the corners of the touch pad TS than in the vicinity of the center of the latter.

Figure 9:
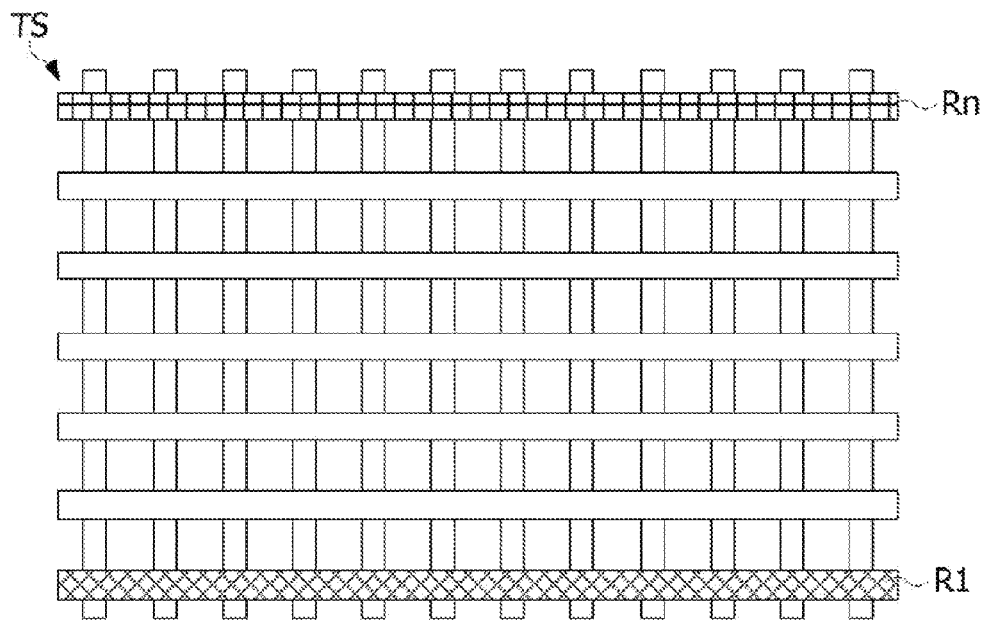

In FIG. 9, only the first and the last row electrodes R1 and Rn (or column electrodes) are activated. In this configuration, one of the two activated electrodes R1 is controlled like a sending electrode in accordance with the columns Pn+i of Table 2, and the other one of the two activated electrodes Rn is controlled like a receiving electrode, in accordance with the columns Pj−1 of Table 2. This configuration is permitted by the circuit IOC2 in FIG. 3, thanks to the use of the switches I4, enabling a group of row electrodes Rj to be connected to the groups of sending electrodes connected to the ports Pk+5 to Pk+7. It will be understood that it is also possible to activate only the first and last column electrodes T1 and Tp and to control one of these two electrodes as receiving electrode. For this purpose, it is sufficient, thanks to the switches I4, not to link the group of row electrodes of the electrode to be controlled as receiving electrode to the group of ports Pk+4 to Pk+7, and to control this electrode in accordance with the columns Pj−1 of Table 2.

Figure 10:
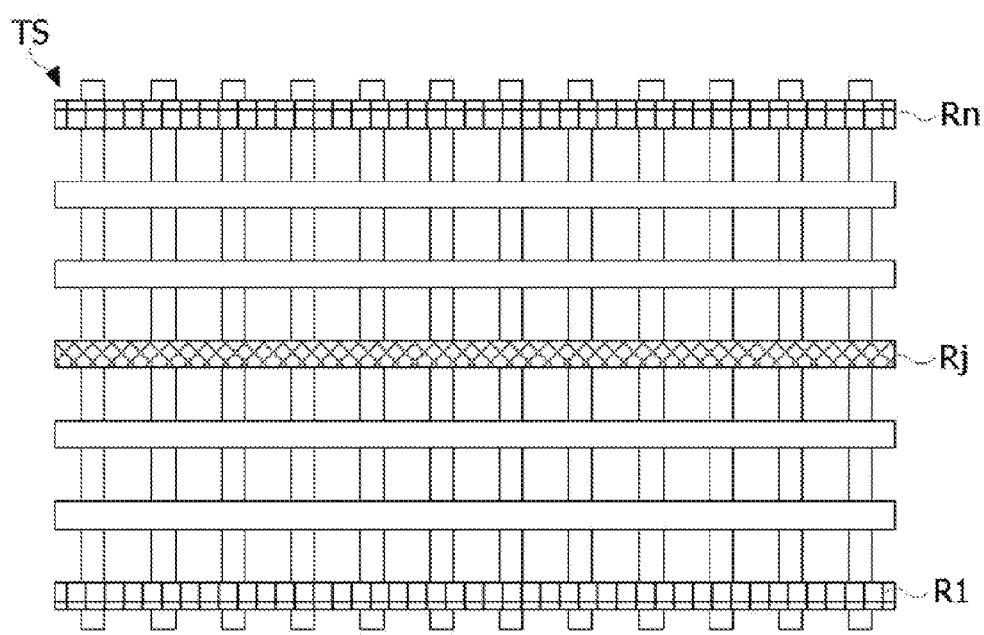

In FIG. 10, only the first and the last row electrode R1 and Rn are controlled, as well as the central row electrode Rj (passing substantially through the center of the touch pad). In this configuration, the central electrode Rj is controlled to operate like a sending electrode, in accordance with the column Pn+j of Table 2, and the other two activated electrodes R1 and Rn are controlled simultaneously to operate like receiving electrodes, in accordance with the column Pj−1 of Table 2. This configuration is permitted by the circuit IOC2 in FIG. 3, thanks to the use of the switches I4, enabling the group of row electrodes comprising the electrode Rj to be connected to the groups of sending electrodes connected to the ports Pk+5 to Pk+7. Compared to the configuration in FIG. 9, the configuration in FIG. 10 has a lower sensitivity, but a higher immunity to noise.

It will be understood by those skilled in the art that various alternative embodiments and various applications of the present disclosure are possible. In particular, the proximity detection mode may be implemented indifferently by one or other of the input/output circuits IOC, IOC1, IOC2, or more generally by a circuit for managing a touch pad implementing a detection method based on capacitance measurements of pairs of electrodes. Furthermore, whether it be in locate mode or in proximity detection mode, a measurement representative of the capacitance of one or more pairs of electrodes of the touch pad may be determined indifferently by executing a fixed number of charge and charge transfer cycles and by measuring the voltage at a terminal of the sampling capacitor after executing the fixed number of cycles, or by executing charge and charge transfer cycles until the voltage at a terminal of the sampling capacitor reaches a threshold voltage, and by using the number of cycles executed.

The values of the voltages supplied to the terminals of the sampling capacitor and to the electrodes are only given as an example, and may vary as long as the following condition is met: Vh>Vrf>0. It is not necessary either to link the electrodes and the sampling capacitor to the ground in steps 3 and 7. The ground voltage applied in steps 3 and 7 may be replaced with a positive and non-zero voltage lower than the voltage Vrf. Furthermore, in the proximity detection mode for example, the voltage Vh may be greater than the voltage of the circuit so as to increase the detection distance.

Furthermore, it goes without saying that the locate mode described with reference to FIGS. 2 and 3 is novel in its own right, independently of the implementation of a proximity detection mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a capacitive touch pad proximity sensor having a first and a second sensor terminal;
a sampling capacitor having a first and a second sampling capacitor terminal, the first and second sampling capacitor terminals selectively coupled to the first and second sensor terminals, respectively;
a charge transfer circuit that includes:
a first voltage source;
a second voltage source at a lower voltage than the first voltage source, both the first and second voltage source at voltages greater than a ground voltage;
a first transistor coupled between the first voltage source and the first sampling capacitor terminal;
a second transistor coupled between the second voltage source and the second sampling capacitor terminal, the first and second transistor configured to pre-charge the sampling capacitor before the sampling capacitor is selectively coupled to the capacitive touch pad proximity sensor; and
a comparator coupled to the first sampling capacitor terminal and configured to compare a voltage on the first sampling capacitor terminal with a reference voltage.

2. The device of claim 1 wherein the first and second transistor are configured to pre-charge the capacitive touch pad proximity sensor before the sampling capacitor is selectively coupled to the capacitive touch pad proximity sensor.

3. The device of claim 1 wherein the capacitive touch pad proximity sensor includes a plurality of electrode rows and a plurality of electrode columns transverse to the plurality of electrode rows, the plurality of electrode rows and plurality of electrode columns creating a plurality of intersections that form a plurality of touch screen capacitors, a number of the touch screen capacitors of the plurality of touch screen capacitors being selectively coupled in turn to the sampling capacitor.

4. The device of claim 1 wherein the capacitive touch pad proximity sensor includes a plurality of triangular electrodes.

5. The device of claim 4 wherein the plurality of triangular electrodes are arranged in groups of four, the groups of four being arranged in rows and columns.

6. The device of claim 4 wherein the plurality of triangular electrodes are arranged in groups of four triangular electrodes where a point of each of the four triangular electrodes is facing a center of the respective group.

7. The device of claim 1 wherein the capacitive touch pad proximity sensor includes a first elongated electrode having a plurality of openings and a plurality of second electrodes, each second electrode positioned in one of the plurality of openings of the first elongated electrode.

8. A system, comprising:
a plurality of first electrodes;
a plurality of second electrodes;
a first electrode terminal coupled to at least one of the first electrodes;
a second electrode terminal coupled to at least one of the second electrodes;
a sampling capacitor having a first and a second sampling capacitor terminal, the first and second sampling capacitor terminals selectively coupled to the first and second electrode terminals, respectively;
a charge transfer circuit that includes:
a first voltage source;
a second voltage;
a first transistor coupled between the first voltage source and the first sampling capacitor terminal;
a second transistor coupled between the second voltage source and the second sampling capacitor terminal; and a comparator coupled to the first sampling capacitor terminal and configured to compare a voltage on the first sampling capacitor terminal with a reference voltage.

9. The system of claim 8 wherein the second voltage source is at a lower voltage than the first voltage source and both the first and second voltage source are at voltages greater than a ground voltage.

10. The system of claim 8 wherein the first and second transistor are configured to pre-charge the sampling capacitor before the sampling capacitor is selectively coupled to the capacitive touch pad proximity sensor.

11. The system of claim 8 wherein the first and second transistor are configured to pre-charge the capacitive touch pad proximity sensor before the sampling capacitor is selectively coupled to the capacitive touch pad proximity sensor.

12. The system of claim 8 wherein the capacitive touch pad proximity sensor includes a plurality of electrode rows and a plurality of electrode columns transverse to the plurality of electrode rows, the plurality of electrode rows and plurality of electrode columns creating a plurality of intersections that form a plurality of touch screen capacitors, a number of the touch screen capacitors of the plurality of touch screen capacitors being selectively coupled in turn to the sampling capacitor.

13. The system of claim 8 wherein the capacitive touch pad proximity sensor includes a plurality of triangular electrodes arranged in groups of four, the groups of four being arranged in rows and columns.

14. The system of claim 8 wherein the capacitive touch pad proximity sensor includes a first elongated electrode having a plurality of openings and a plurality of second electrodes, each second electrode positioned in one of the plurality of openings of the first elongated electrode.

15. A device, comprising:
a plurality of pair of electrodes, each pair of electrodes having a first electrode terminal and a second electrode terminal;
a charge-transfer circuit, that includes:
a first voltage source;
a second voltage source at a lower voltage than the first voltage source, both the first and second voltage source at voltages greater than or equal to a ground voltage;
a sampling capacitor that is coupled between the first voltage source and the second voltage source and is configured to be charged by the first and second voltage sources, the sampling capacitor being configured to transfer charge from each pair of electrodes, the sampling capacitor having a first and a second sampling capacitor terminal, the first and second sampling capacitor terminals selectively coupled to ones of the first and second electrode terminals, respectively; and
a comparator coupled to the first sampling capacitor terminal and configured to compare a voltage on the first sampling capacitor terminal with a reference voltage.

16. The device of claim 15, further comprising a location detector configured to determine a position of an object on with respect to the plurality of pairs of electrodes according to an output of the comparator.

17. The device of claim 15 wherein the charge transfer circuit that includes a first transistor coupled between the first voltage source and the first sampling capacitor terminal and a second transistor coupled between the second voltage source and the second sampling capacitor terminal, the first and second transistor configured to pre-charge the sampling capacitor before the sampling capacitor is selectively coupled to the capacitive touch pad proximity sensor.

\* \* \* \* \*